United States Patent
Rofougaran et al.

(10) Patent No.: US 8,660,500 B2
(45) Date of Patent: Feb. 25, 2014

(54) METHOD AND SYSTEM FOR A VOLTAGE-CONTROLLED OSCILLATOR WITH A LEAKY WAVE ANTENNA

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 704 days.

(21) Appl. No.: 12/650,224

(22) Filed: Dec. 30, 2009

(65) Prior Publication Data
US 2010/0311379 A1    Dec. 9, 2010

Related U.S. Application Data

(60) Provisional application No. 61/246,618, filed on Sep. 29, 2009, provisional application No. 61/185,245, filed on Jun. 9, 2009.

(51) Int. Cl.
H04B 1/46 (2006.01)
H04B 1/04 (2006.01)
H04B 1/18 (2006.01)
H04B 1/06 (2006.01)

(52) U.S. Cl.
USPC ............ 455/73; 455/82; 455/121; 455/193.1; 455/269; 343/700 R

(58) Field of Classification Search
USPC ............... 455/81–82, 121–123, 193.1–193.3, 455/269–274, 562.1, 575.7; 343/700 R
See application file for complete search history.

(56) References Cited

U.S. PATENT DOCUMENTS

| | | |
|---|---|---|
| 4,701,763 A | 10/1987 | Yamamoto |
| 5,138,436 A | 8/1992 | Koepf |
| 5,300,875 A | 4/1994 | Tuttle |
| 5,363,075 A | 11/1994 | Fanucchi |
| 5,387,885 A | 2/1995 | Chi |
| 5,717,943 A | 2/1998 | Barker |
| 5,900,843 A | 5/1999 | Lee |
| 5,912,598 A | 6/1999 | Stones |
| 6,005,520 A | 12/1999 | Nalbandian |

(Continued)

OTHER PUBLICATIONS

Iyer et al., "Wireless chip to chip interconnections for multichip modules using leaky wave antennas", Nov. 1993, pp. 2030-2031.

(Continued)

*Primary Examiner* — Simon Nguyen
(74) *Attorney, Agent, or Firm* — Farjami & Farjami LLP

(57) ABSTRACT

Methods and systems for a voltage-controlled oscillator (VCO) with a leaky wave antenna are disclosed and may include transmitting wireless signals via one or more leaky wave antennas in one or more tank circuits coupled to one or more VCOs. The VCOs may be two-point modulated. Two modulating signals may be communicated to the one or more VCOs via varactors coupled to tank circuits on the one or more VCOs. The varactors may include CMOS transistors with source and drain terminals shorted together. The one or more leaky wave antennas may be integrated on the chip, on a package to which the chip is affixed, or on a printed circuit board to which the chip is affixed. The VCOs may be integrated in a phase-locked loop and an output of the one or more VCOs in the phase-locked loop may be fed back via a multi-modulus detector.

20 Claims, 9 Drawing Sheets

(56) References Cited

U.S. PATENT DOCUMENTS

| | | | |
|---|---|---|---|
| 6,037,743 A | 3/2000 | White | |
| 6,127,799 A | 10/2000 | Krishnan | |
| 6,212,431 B1 | 4/2001 | Hahn | |
| 6,285,325 B1 | 9/2001 | Nalbandian | |
| 6,515,554 B2* | 2/2003 | Ishikawa et al. | 333/21 R |
| 6,597,323 B2 | 7/2003 | Teshirogi | |
| 6,603,915 B2 | 8/2003 | Glebov | |
| 6,735,630 B1 | 5/2004 | Gelvin | |
| 6,771,935 B1 | 8/2004 | Leggett | |
| 6,841,981 B2 | 1/2005 | Smith | |
| 6,954,236 B1 | 10/2005 | Russell | |
| 7,002,517 B2 | 2/2006 | Noujeim | |
| 7,020,701 B1 | 3/2006 | Gelvin | |
| 7,023,374 B2 | 4/2006 | Jossef | |
| 7,084,823 B2 | 8/2006 | Caimi | |
| 7,242,359 B2* | 7/2007 | Turner et al. | 343/742 |
| 7,253,780 B2 | 8/2007 | Sievenpiper | |
| 7,268,517 B2 | 9/2007 | Rahmel | |
| 7,317,342 B2 | 1/2008 | Saint-Laurent | |
| 7,330,090 B2 | 2/2008 | Itoh | |
| 7,348,928 B2 | 3/2008 | Ma | |
| 7,373,133 B2 | 5/2008 | Mickle | |
| 7,379,023 B2* | 5/2008 | Yamanaka et al. | 343/700 MS |
| 7,391,288 B1* | 6/2008 | Itoh et al. | 333/219 |
| 7,394,288 B1 | 7/2008 | Agarwal | |
| 7,535,958 B2 | 5/2009 | Best | |
| 7,592,957 B2 | 9/2009 | Achour | |
| 7,602,346 B2* | 10/2009 | Takei et al. | 343/745 |
| 7,620,424 B2 | 11/2009 | Cetiner | |
| 7,733,265 B2 | 6/2010 | Margomenos | |
| 7,855,696 B2 | 12/2010 | Gummalla | |
| 7,917,115 B2* | 3/2011 | Baker | 455/277.1 |
| 8,148,986 B2* | 4/2012 | Driesel et al. | 324/318 |
| 8,195,103 B2 | 6/2012 | Waheed | |
| 8,242,957 B2 | 8/2012 | Rofougaran | |
| 8,285,231 B2 | 10/2012 | Rofougaran | |
| 8,295,788 B2 | 10/2012 | Rofougaran | |
| 8,299,971 B2 | 10/2012 | Talty | |
| 2002/0000936 A1 | 1/2002 | Sheen | |
| 2002/0005807 A1 | 1/2002 | Sheen | |
| 2002/0041256 A1 | 4/2002 | Saitou | |
| 2002/0135568 A1 | 9/2002 | Chen | |
| 2002/0171498 A1* | 11/2002 | Leenaerts et al. | 331/100 |
| 2002/0180568 A1* | 12/2002 | Atokawa et al. | 333/202 |
| 2003/0122729 A1 | 7/2003 | Diaz | |
| 2004/0066251 A1 | 4/2004 | Eleftheriades | |
| 2004/0203944 A1 | 10/2004 | Huomo | |
| 2004/0227667 A1* | 11/2004 | Sievenpiper | 343/700 MS |
| 2004/0227668 A1 | 11/2004 | Sievenpiper | |
| 2004/0257220 A1* | 12/2004 | Fischer et al. | 340/531 |
| 2004/0263378 A1 | 12/2004 | Jossef | |
| 2004/0263408 A1 | 12/2004 | Sievenpiper | |
| 2005/0012667 A1 | 1/2005 | Noujeim | |
| 2005/0052282 A1* | 3/2005 | Rodgers et al. | 340/572.1 |
| 2005/0052424 A1 | 3/2005 | Shih | |
| 2005/0116864 A1 | 6/2005 | Mohamadi | |
| 2005/0134579 A1 | 6/2005 | Hsieh | |
| 2005/0136972 A1 | 6/2005 | Smith | |
| 2006/0066326 A1 | 3/2006 | Slupsky | |
| 2006/0109127 A1 | 5/2006 | Barink | |
| 2006/0125703 A1 | 6/2006 | Ma | |
| 2006/0208957 A1* | 9/2006 | Iizuka et al. | 343/801 |
| 2006/0281423 A1 | 12/2006 | Caimi | |
| 2007/0171076 A1 | 7/2007 | Stevens | |
| 2007/0190952 A1 | 8/2007 | Waheed | |
| 2007/0273607 A1 | 11/2007 | Chen | |
| 2007/0285248 A1 | 12/2007 | Hamel | |
| 2007/0287403 A1 | 12/2007 | Sjoland | |
| 2008/0007358 A1* | 1/2008 | Gabara | 331/117 R |
| 2008/0068174 A1 | 3/2008 | Al-Mahdawi | |
| 2008/0105966 A1 | 5/2008 | Beer | |
| 2008/0159243 A1 | 7/2008 | Rofougaran | |
| 2008/0231603 A1 | 9/2008 | Parkinson | |
| 2008/0258978 A1* | 10/2008 | Stuart | 343/700 MS |
| 2008/0258981 A1 | 10/2008 | Achour | |
| 2008/0278400 A1 | 11/2008 | Lohninger | |
| 2008/0284085 A1 | 11/2008 | Curina | |
| 2008/0303734 A1* | 12/2008 | Teshirogi et al. | 343/785 |
| 2008/0316135 A1 | 12/2008 | Hilgers | |
| 2009/0021325 A1* | 1/2009 | Lee et al. | 333/124 |
| 2009/0040124 A1* | 2/2009 | Iizuka et al. | 343/806 |
| 2009/0108996 A1 | 4/2009 | Day | |
| 2009/0160612 A1 | 6/2009 | Varpula | |
| 2009/0243779 A1* | 10/2009 | Rofougaran | 336/200 |
| 2009/0251362 A1 | 10/2009 | Margomenos | |
| 2009/0257529 A1* | 10/2009 | Popplewell et al. | 375/320 |
| 2010/0036369 A1* | 2/2010 | Hancock | 606/33 |
| 2010/0110943 A2* | 5/2010 | Gummalla et al. | 370/281 |
| 2010/0222105 A1 | 9/2010 | Nghiem | |
| 2010/0308668 A1 | 12/2010 | Rofougaran | |
| 2010/0308767 A1 | 12/2010 | Rofougaran | |
| 2010/0308885 A1 | 12/2010 | Rofougaran | |
| 2010/0308970 A1 | 12/2010 | Rofougaran | |
| 2010/0308997 A1 | 12/2010 | Rofougaran | |
| 2010/0309040 A1 | 12/2010 | Rofougaran | |
| 2010/0309056 A1 | 12/2010 | Rofougaran | |
| 2010/0309069 A1 | 12/2010 | Rofougaran | |
| 2010/0309071 A1 | 12/2010 | Rofougaran | |
| 2010/0309072 A1 | 12/2010 | Rofougaran | |
| 2010/0309073 A1 | 12/2010 | Rofougaran | |
| 2010/0309074 A1 | 12/2010 | Rofougaran | |
| 2010/0309075 A1 | 12/2010 | Rofougaran | |
| 2010/0309076 A1 | 12/2010 | Rofougaran | |
| 2010/0309077 A1 | 12/2010 | Rofougaran | |
| 2010/0309078 A1 | 12/2010 | Rofougaran | |
| 2010/0309079 A1 | 12/2010 | Rofougaran | |
| 2010/0309824 A1 | 12/2010 | Rofougaran | |
| 2010/0311324 A1 | 12/2010 | Rofougaran | |
| 2010/0311332 A1 | 12/2010 | Rofougaran | |
| 2010/0311333 A1 | 12/2010 | Rofougaran | |
| 2010/0311338 A1 | 12/2010 | Rofougaran | |
| 2010/0311340 A1 | 12/2010 | Rofougaran | |
| 2010/0311355 A1 | 12/2010 | Rofougaran | |
| 2010/0311356 A1 | 12/2010 | Rofougaran | |
| 2010/0311359 A1 | 12/2010 | Rofougaran | |
| 2010/0311363 A1 | 12/2010 | Rofougaran | |
| 2010/0311364 A1 | 12/2010 | Rofougaran | |
| 2010/0311367 A1 | 12/2010 | Rofougaran | |
| 2010/0311368 A1 | 12/2010 | Rofougaran | |
| 2010/0311369 A1 | 12/2010 | Rofougaran | |
| 2010/0311376 A1 | 12/2010 | Rofougaran | |
| 2010/0311379 A1 | 12/2010 | Rofougaran | |
| 2010/0311380 A1 | 12/2010 | Rofougaran | |
| 2010/0311472 A1 | 12/2010 | Rofougaran | |
| 2010/0311493 A1 | 12/2010 | Miller | |
| 2011/0039501 A1* | 2/2011 | Achour et al. | 455/73 |
| 2012/0095531 A1 | 4/2012 | Derbas | |
| 2012/0153731 A9 | 6/2012 | Kirby | |
| 2012/0263256 A1 | 10/2012 | Waheed | |

OTHER PUBLICATIONS

Huang et al., "An Electronically Switchable Leaky Wave Antenna", Nov. 2000, pp. 1769-1772.

Grbic et al., "Leaky CPW-Based Slot Antenna Arrays for Millimeter-Wave Applications", Nov. 2002, pp. 1494-1504.

Floyd et al., "Wireless Interconnects for Clock Distribution", pp. 105-108.

Zvolensky et al., "Leaky-Wave antenna based on micro-electromechanical systems-loaded microstrip line", 2011, pp. 357-363.

O, K.K. et al., "Silicon Integrated Circuits Incorporating Antennas", IEEE Custom Integrated Circuits Conference, 2006, pp. 473-480.

Sterner et al., "RF MEMS High-Impedance Tuneable Metamaterials for Millimeter-Wave Beam Steering", Micro Electro Mechanical Systems, 2009, pp. 896-899.

Ourir et al., "Electronically Reconfigurable Metamaterial for Compact Directive Cavity Antennas", Electronics Letters, 2007.

Kimoto et al., "On-Chip Wireless Signal Transmission using Silicon Integrated Antennas", Measurement 40, No. 30, (2004): 20.

Feresidis et al., "Flat Plate Millimetre Wave Antenna Based on Partially Reflective FSS", 11$^{th}$ International Conference on Antennas and Propagation, 2001, pp. 33-36.

* cited by examiner

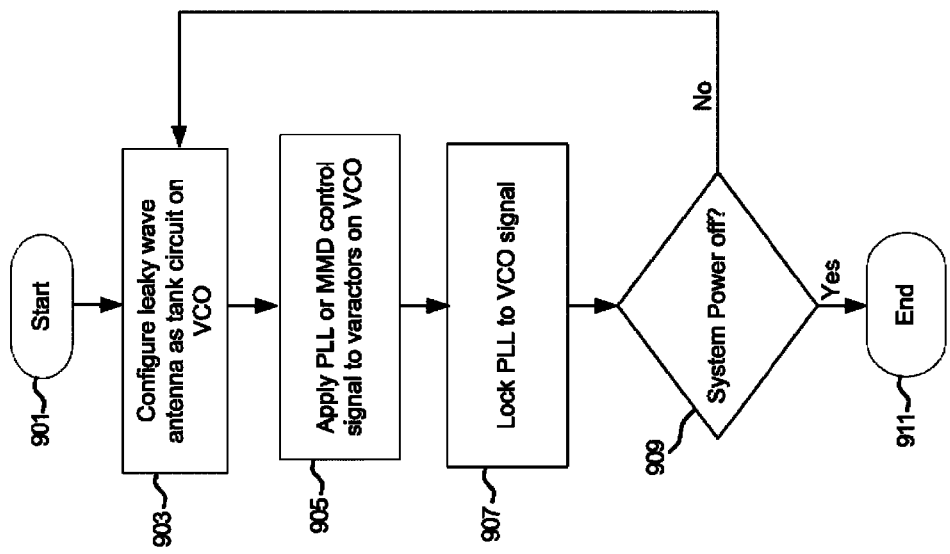

METHOD AND SYSTEM FOR A VOLTAGE-CONTROLLED OSCILLATOR WITH A LEAKY WAVE ANTENNA

CROSS-REFERENCE TO RELATED APPLICATIONS/INCORPORATION BY REFERENCE

This application makes reference to and claims priority to U.S. Provisional Application Ser. No. 61/246,618 filed on Sep. 29, 2009, and U.S. Provisional Application Ser. No. 61/185,245 filed on Jun. 9, 2009.

This application also makes reference to:
U.S. patent application Ser. No. 12/650,212 filed on even date herewith;
U.S. patent application Ser. No. 12/650,295 filed on even date herewith;
U.S. patent application Ser. No. 12/650,277 filed on even date herewith;
U.S. patent application Ser. No. 12/650,192 filed on even date herewith;
U.S. patent application Ser. No. 12/650,176 filed on even date herewith;
U.S. patent application Ser. No. 12/650,246 filed on even date herewith;
U.S. patent application Ser. No. 12/650,292 filed on even date herewith; and
U.S. patent application Ser. No. 12/650,324 filed on even date herewith.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for a voltage-controlled oscillator with a leaky wave antenna.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a voltage-controlled oscillator with a leaky wave antenna, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 9 is a block diagram illustrating exemplary steps for two-point modulation of a voltage-controlled oscillator with a leaky wave antenna, in accordance with an embodiment of the invention.

DETAILED DESCRIPTION OF THE INVENTION

Certain aspects of the invention may be found in a method and system for a voltage-controlled oscillator with a leaky wave antenna. Exemplary aspects of the invention may comprise transmitting wireless signals via one or more leaky wave antennas in one or more tank circuits coupled to one or more VCOs. The VCOs may be two-point modulated. Two modulating signals may be communicated to the one or more VCOs via varactors coupled to tank circuits on the one or more VCOs. The varactors may comprise CMOS transistors with source and drain terminals that are shorted together. The one or more leaky wave antennas may be integrated on the chip, on a package to which the chip is affixed, or on a printed circuit board to which the chip is affixed. The VCOs may be integrated in a phase-locked loop and an output of the one or more VCOs in the phase-locked loop may be fed back via a multi-modulus detector.

Figure 1:
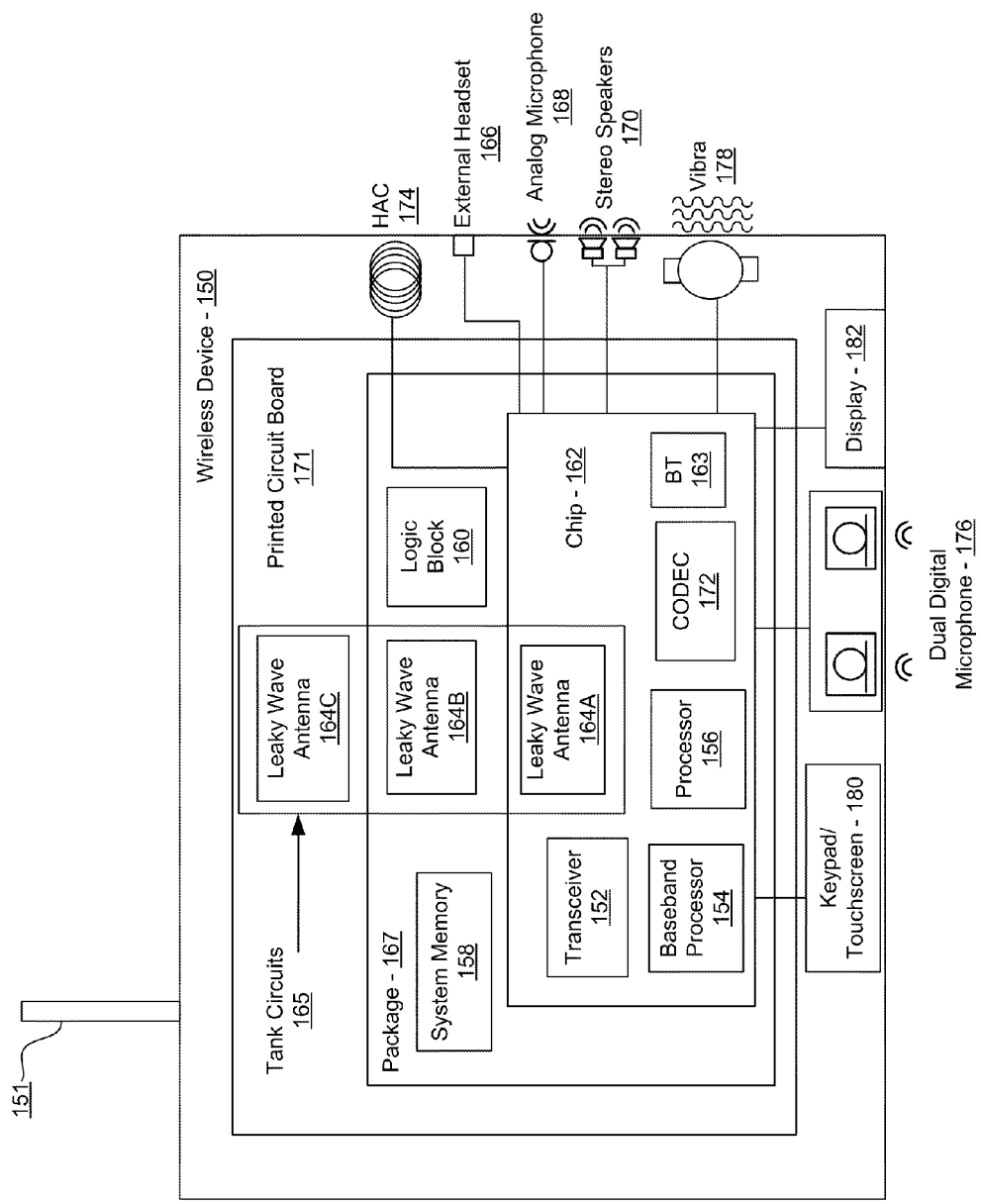
FIG. 1 is a block diagram of an exemplary wireless system utilizing leaky wave antennas as a load on a voltage-controlled oscillator, which may be utilized in accordance with an embodiment of the invention.

FIG. 1 is a block diagram of an exemplary wireless system utilizing leaky wave antennas as a load on a voltage-controlled oscillator, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, leaky wave antennas 164A, 164B, and 164C, tank circuits 165, an external headset port 166, and a package 167. The wireless device 150 may also comprise an analog microphone 168, integrated hands-free (IHF) stereo speakers 170, a printed circuit board 171, a hearing aid compatible (HAC) coil 174, a dual digital microphone 176, a vibration transducer 178, a keypad and/or touchscreen 180, and a display 182.

The transceiver 152 may comprise suitable logic, circuitry, interface(s), and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151, or the leaky wave antennas 164A, 164B, and 164C. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, 3GPP, UMTS, BLUETOOTH, and ZigBee, for example.

The baseband processor 154 may comprise suitable logic, circuitry, interface(s), and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, interface(s), and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interface(s), and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interface(s), and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example The CODEC 172 may comprise suitable circuitry, logic, interface(s), and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, $I^2S$ FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The chip 162 may comprise an integrated circuit with multiple functional blocks integrated within, such as the transceiver 152, the processor 156, the baseband processor 154, the BT radio/processor 163, the CODEC 172, and the leaky wave antenna 164A. The number of functional blocks integrated in the chip 162 is not limited to the number shown in FIG. 1. Accordingly, any number of blocks may be integrated on the chip 162 depending on chip space and wireless device 150 requirements, for example.

The leaky wave antennas 164A, 164B, and 164C may comprise a resonant cavity with a highly reflective surface and a lower reflectivity surface, and may be integrated in and/or on the chip 162, the package 167, and/or the printed circuit board 171. The reduced reflectivity surface may allow the resonant mode to "leak" out of the cavity. The lower reflectivity surface of the leaky wave antennas 164A, 164B, and 164C may be configured with slots in a metal surface, or a pattern of metal patches, as described further in FIGS. 2 and 3. The physical dimensions of the leaky wave antennas 164A, 164B, and 164C may be configured to optimize bandwidth of transmission and/or the beam pattern radiated. In another embodiment of the invention, the leaky wave antenna 164B may be integrated in and/or on the package 167, and the leaky wave antenna 164C may be integrated in and/or on the printed circuit board 171 to which the chip 162 may be affixed. In this manner, the dimensions of the leaky wave antennas 164B and 164C may not be limited by the size of the chip 162. The leaky wave antennas 164A and 164B may provide a load on the VCO as well as enable transmission of wireless signals at a frequency configured by the VCO.

The tank circuits 165 may comprise a plurality of impedances such as capacitors, inductors, and/or resistors, for example. The tank circuits 165 may comprise leaky wave antenna 164A and/or 164B and may be enabled to transmit signals from a voltage-controlled oscillator in the transceiver 152. The inductors within the tank circuits 165 may comprise leaky wave antennas, which may be utilized for configuring an inductance in the tank circuits 165 as well as enabling the transmission of a wireless signal. In this manner, the tank circuits 165 may comprise a load for a voltage-controlled oscillator (VCO) in the transceiver 152. A resonance frequency configured by the impedances in the tank circuits 165 may enable the generation of an output signal of the VCO at the resonance frequency and filtering out signals not at the desired frequency.

The external headset port 166 may comprise a physical connection for an external headset to be communicatively coupled to the wireless device 150. The analog microphone 168 may comprise suitable circuitry, logic, interface(s), and/or code that may detect sound waves and convert them to electrical signals via a piezoelectric effect, for example. The electrical signals generated by the analog microphone 168 may comprise analog signals that may require analog to digital conversion before processing.

The package 167 may comprise a ceramic package, a printed circuit board, or other support structure for the chip 162 and other components of the wireless device 150. In this regard, the chip 162 may be bonded to the package 167. The package 167 may comprise insulating and conductive material, for example, and may provide isolation between electrical components mounted on the package 167.

The stereo speakers 170 may comprise a pair of speakers that may be operable to generate audio signals from electrical signals received from the CODEC 172. The HAG coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, interface(s), and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, interface(s), and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

Figure 7:
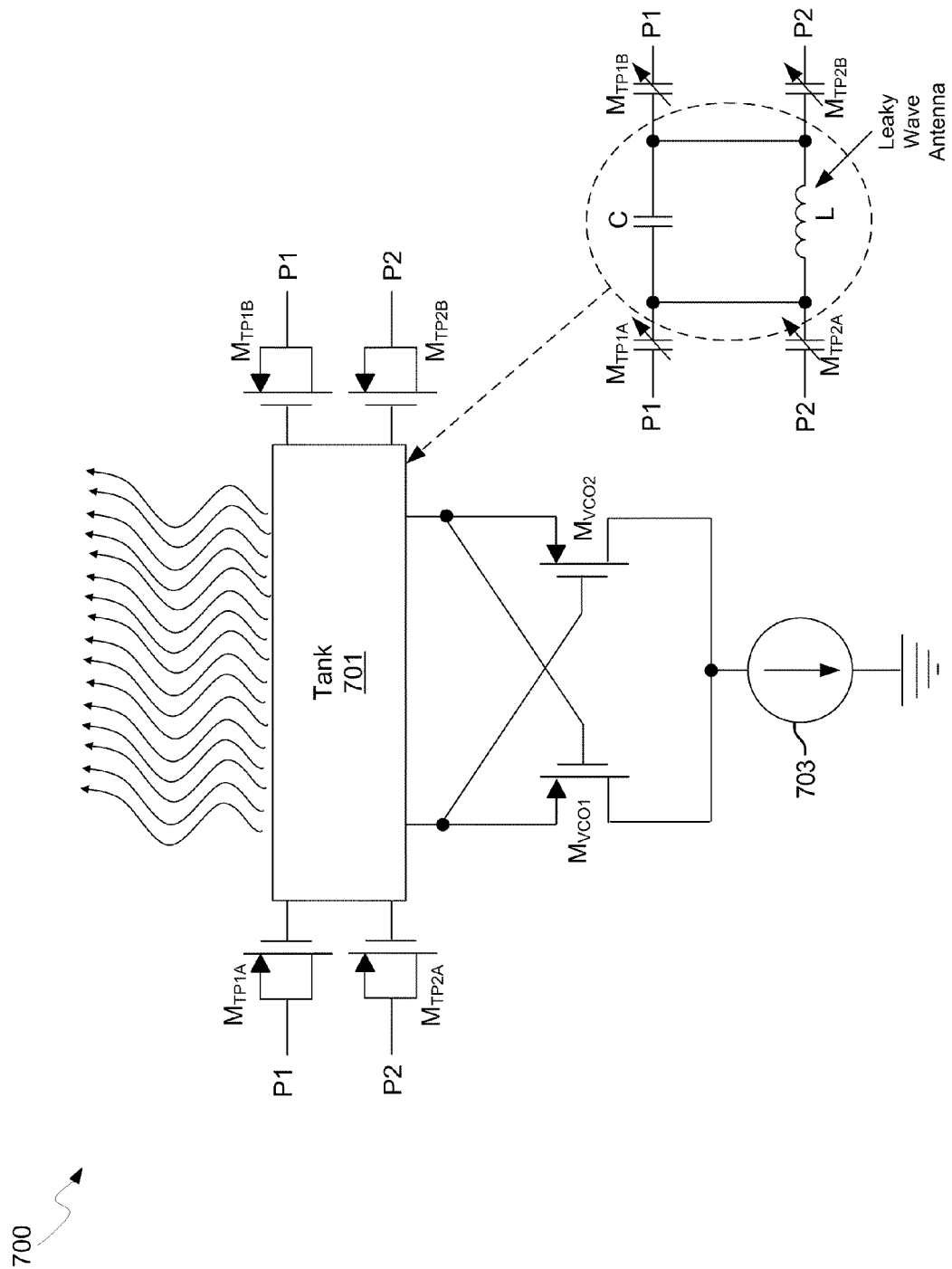
FIG. 7 is a block diagram of a voltage-controlled oscillator with a tank circuit including a leaky wave antenna, in accordance with an embodiment of the invention.
Figure 8:
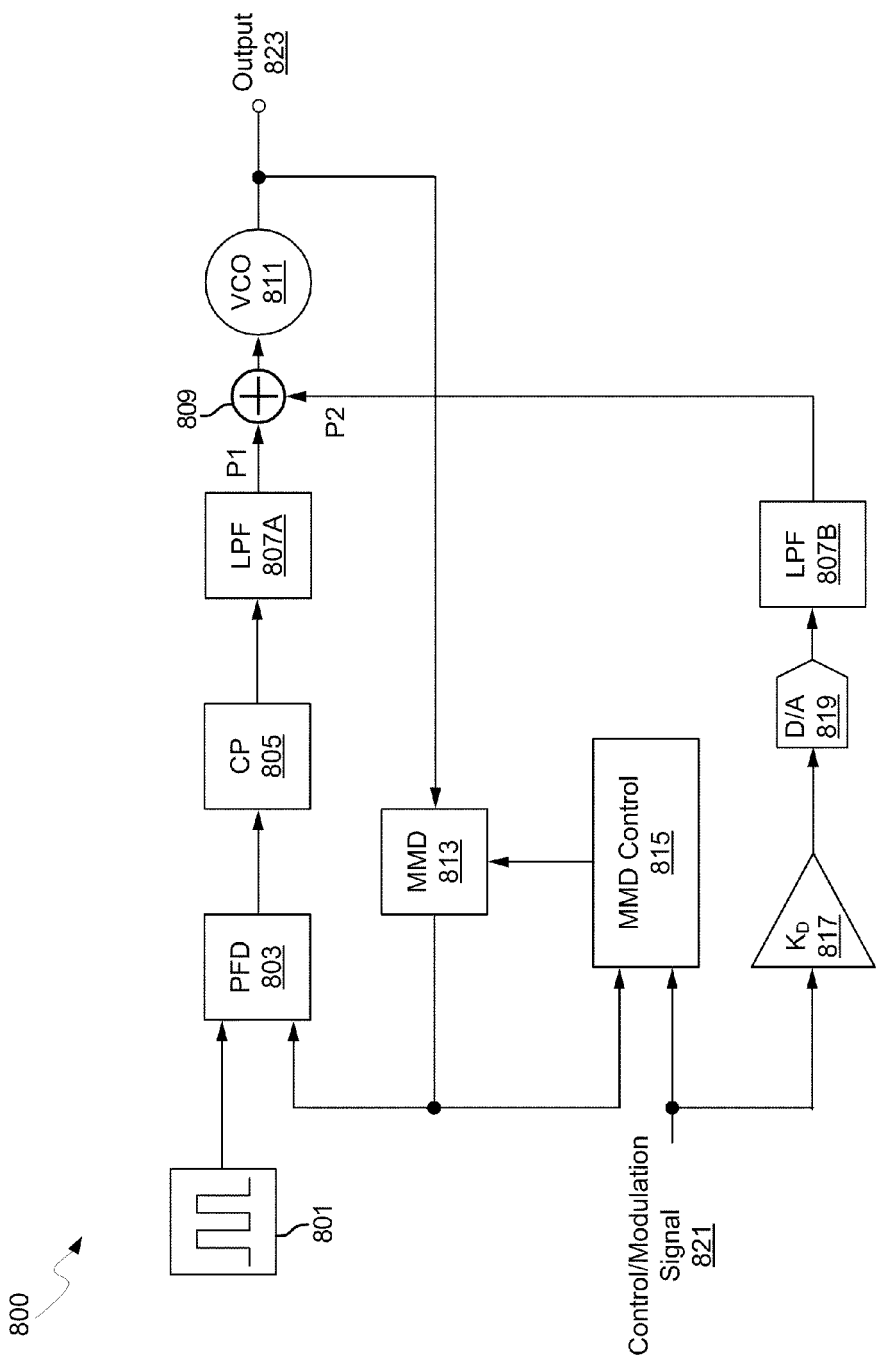
FIG. 8 is a block diagram of a phase-locked loop with two-point modulation utilizing a voltage-controlled oscillator and a tank circuit including a leaky wave antenna, in accordance with an embodiment of the invention.

Frequency modulation (FM) transmission may be enabled in the wireless device 150 by modulating the control voltage on a voltage controlled oscillator in the transceiver 152, as described further, for example, with respect to FIGS. 7 and 8. The modulation of the voltage on the VCO may modulate the frequency generated by the VCO and thus the signal that may transmitted by the leaky wave antenna 164A, 164B, and/or 164C in the tank circuits 165. In an embodiment of the invention, two-point modulation of the VCO may be enabled by utilizing two varactor pairs as inputs to the VCO, as described with respect to FIG. 8.

Figure 2:
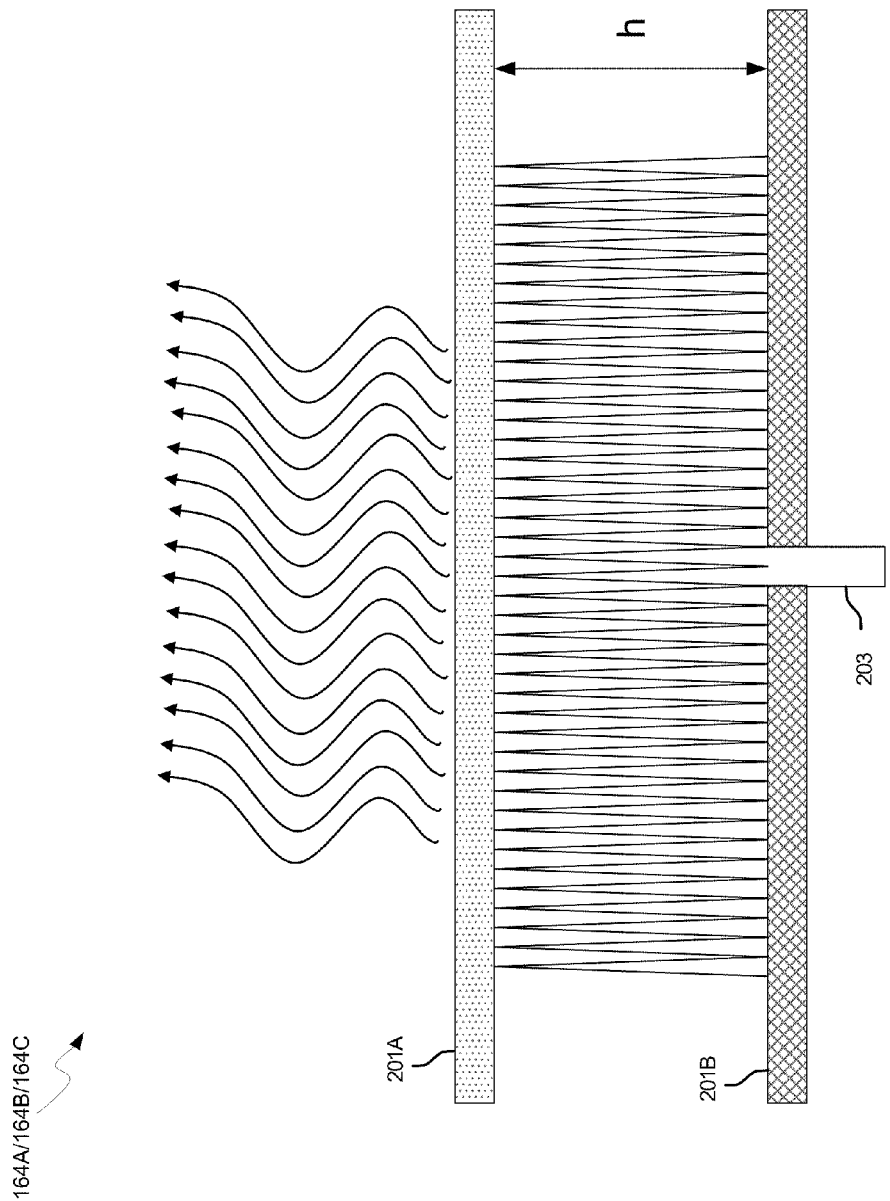
FIG. 2 is a block diagram illustrating an exemplary leaky wave antenna, in accordance with an embodiment of the invention.

FIG. 2 is a block diagram illustrating an exemplary leaky wave antenna, in accordance with an embodiment of the invention. Referring to FIG. 2, there is shown the leaky wave antennas 164A and/or 164B comprising a partially reflective surface 201A, a reflective surface 201B, and a feed point 203. The space between the partially reflective surface 201A and the reflective surface 201B may be filled with dielectric material, for example, and the height, h, between the partially reflective surface 201A and the reflective surface 201B may be utilized to configure the frequency of transmission of the leaky wave antennas 164A and/or 164B.

The feed point 203 may comprise a input terminal for applying an input voltage to the leaky wave antennas 164A and/or 164B. The invention is not limited to a single feed point 203, as there may be any amount of feed points for different phases of signal, for example, to be applied to the leaky wave antennas 164A and/or 164B.

In an embodiment of the invention, the height, h, may be one-half the wavelength of the transmitted mode from the leaky wave antennas 164A and/or 164B. In this manner, the phase of an electromagnetic mode that traverses the cavity twice may be coherent with the input signal at the feed point 203, thereby configuring a resonant cavity known as a Fabry-Perot cavity. The magnitude of the resonant mode may decay exponentially in the lateral direction from the feed point 203, thereby reducing or eliminating the need for confinement structures to the sides of the leaky wave antennas 164A and/or 164B. The input impedance of the leaky wave antennas 164A and/or 164B may be configured by the vertical placement of the feed point 203, as described further in FIG. 6.

In operation, a signal to be transmitted via a power amplifier may be communicated to the feed point 203 of the leaky wave antennas 164A and/or 164B with a frequency f. The cavity height, h, may be configured to correlate to one half the wavelength of the signal of frequency f. The signal may traverse the height of the cavity and may be reflected by the partially reflective surface 201A, and then traverse the height back to the reflective surface 201B. Since the wave will have travelled a distance corresponding to a full wavelength, constructive interference may result and a resonant mode may thereby be established.

Leaky wave antennas may enable the configuration of high gain antennas without the need for a large array of antennas which require a complex feed network and suffer from loss due to feed lines. The leaky wave antennas 164A and/or 164B may be integrated on or in a chip, package, or printed circuit board. The leaky wave antennas 164A and/or 164B may comprise an inductor in a tank circuit as a load on a VCO.

Frequency modulation (FM) transmission may be enabled in the wireless device 150 by modulating the control voltage on a voltage controlled oscillator in the transceiver 152, as described further with respect to FIGS. 7 and 8. The modulation of the voltage on the VCO may modulate the frequency generated by the VCO and thus the signal that may be transmitted by the leaky wave antennas 164A and/or 164B in the tank circuits 165. In an embodiment of the invention, two-point modulation of the VCO may be enabled by utilizing two varactor pairs as inputs to the VCO, as described with respect to FIG. 8.

Figure 3:
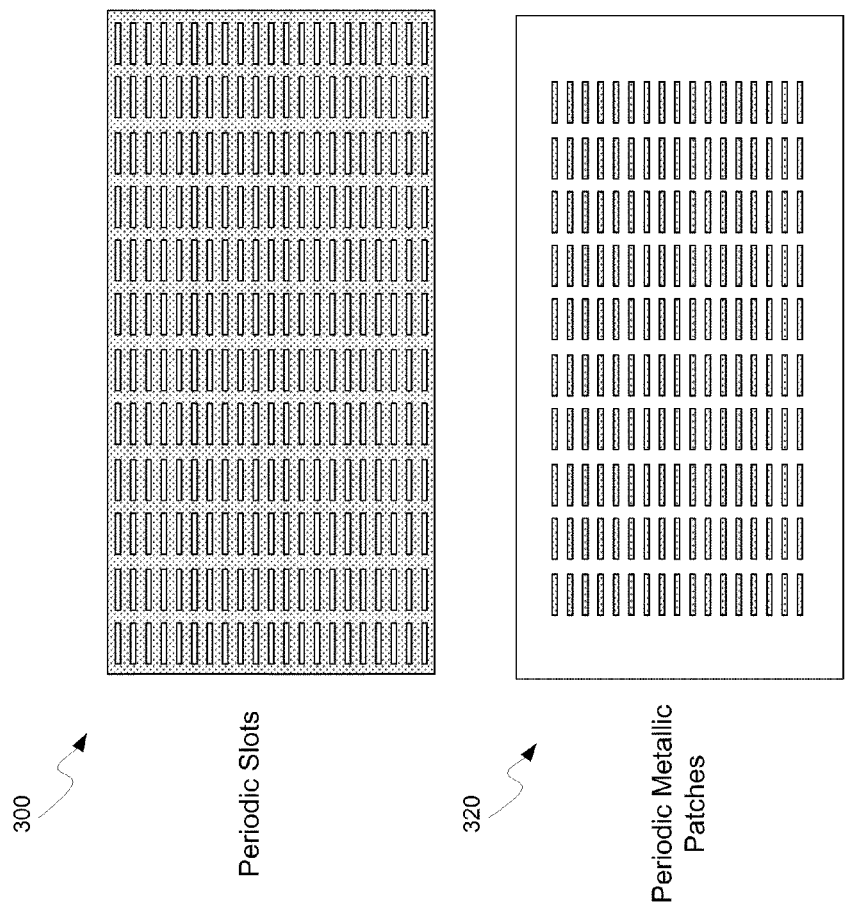
FIG. 3 is a block diagram illustrating a plan view of exemplary partially reflective surfaces, in accordance with an embodiment of the invention.

FIG. 3 is a block diagram illustrating a plan view of exemplary partially reflective surfaces, in accordance with an embodiment of the invention. Referring to FIG. 3, there is shown a partially reflective surface 300 comprising periodic slots in a metal surface, and a partially reflective surface 320 comprising periodic metal patches. The partially reflective surfaces 300/320 may comprise different embodiments of the partially reflective surface 201A described with respect to FIG. 2.

The spacing, dimensions, shape, and orientation of the slots and/or patches in the partially reflective surfaces 300/320 may be utilized to configure the bandwidth, and thus Q-factor, of the resonant cavity defined by the partially reflective surfaces 300/320 and a reflective surface, such as the reflective surface 201B, described with respect to FIG. 2. The partially reflective surfaces 300/320 may thus comprise frequency selective surfaces due to the narrow bandwidth of signals that may leak out of the structure as configured by the slots and/or patches.

The spacing between the patches and/or slots may be related to wavelength of the signal transmitted and/or received, which may be somewhat similar to beamforming with multiple antennas. The length of the slots and/or patches may be several times larger than the wavelength of the transmitted and/or received signal or less, for example, since the leakage from the slots and/or regions surround the patches may add up, similar to beamforming with multiple antennas.

In an embodiment of the invention, the slots/patches may be configured via micro-electromechanical system (MEMS) switches to tune the Q of the resonant cavity.

Figure 4:
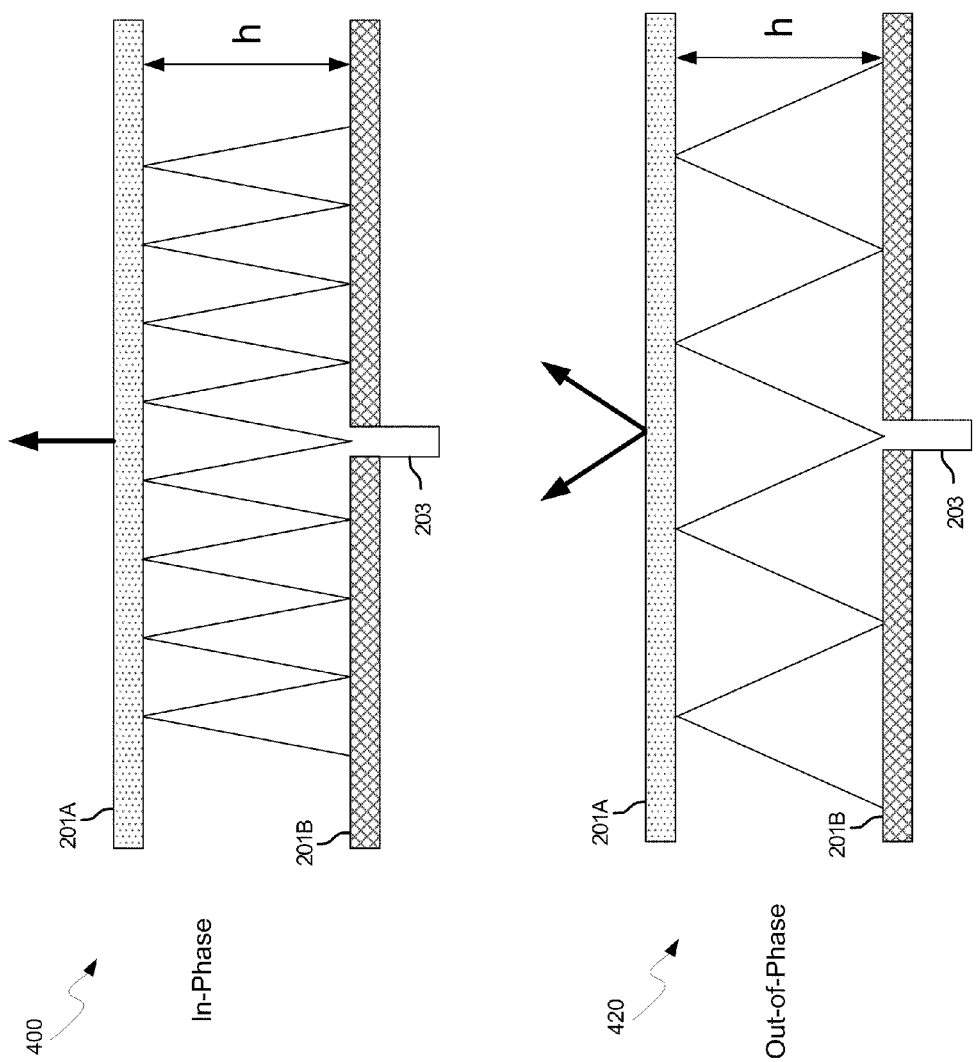
FIG. 4 is a block diagram illustrating an exemplary phase dependence of a leaky wave antenna, in accordance with an embodiment of the invention.

FIG. 4 is a block diagram illustrating an exemplary phase dependence of a leaky wave antenna, in accordance with an embodiment of the invention. Referring to FIG. 4, there is shown a leaky wave antenna comprising the partial reflective surface 201A, the reflective surface 201B, and the feed point 203. In-phase condition 400 illustrates the relative beam shape transmitted by the leaky wave antennas 164A and/or 164B when the frequency of the signal communicated to the feed point 203 matches that of the resonant cavity as defined by the cavity height, h, and the dielectric constant of the material between the reflective surfaces.

Similarly, out-of-phase condition 420 illustrates the relative beam shape transmitted by the leaky wave antennas 164A and/or 164B when the frequency of the signal communicated to the feed point 203 does not match that of the resonant cavity. The resulting beam shape may be conical, as opposed to a single main vertical node. These are illustrated further with respect to FIG. 5.

Figure 5:
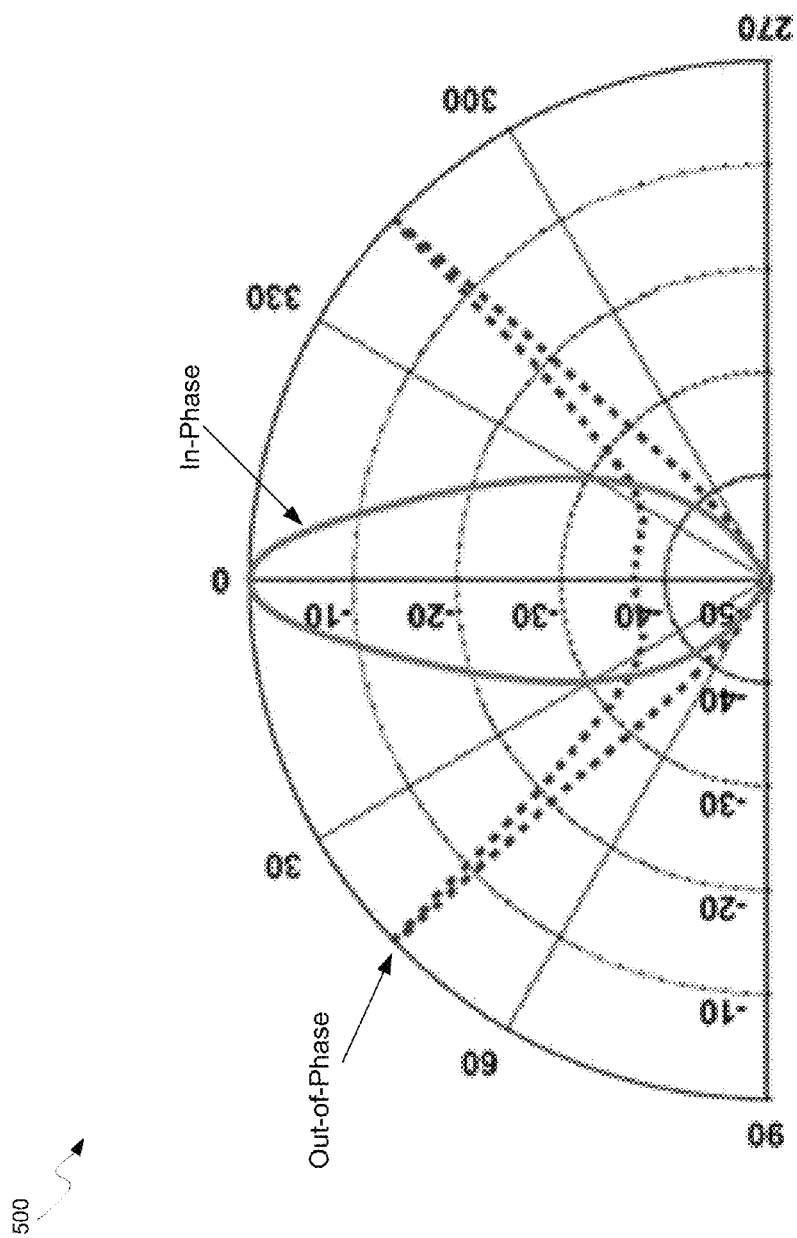
FIG. 5 is a block diagram illustrating exemplary in-phase and out-of-phase beam shapes for a leaky wave antenna, in accordance with an embodiment of the invention.

FIG. 5 is a block diagram illustrating exemplary in-phase and out-of-phase beam shapes for a leaky wave antenna, in accordance with an embodiment of the invention. Referring to FIG. 5, there is shown a plot 500 of transmitted signal beam shape versus angle for the in-phase and out-of-phase conditions for a leaky wave antenna.

The In-phase curve in the plot 500 may correlate to the case where the frequency of the signal communicated to a leaky wave antenna matches the resonant frequency of the cavity. In this manner, a single vertical main node may result. In instances where the frequency of the signal at the feed point is not at the resonant frequency, a double, or conical-shaped node may be generated as shown by the Out-of-phase curve in the plot 500.

Figure 6:
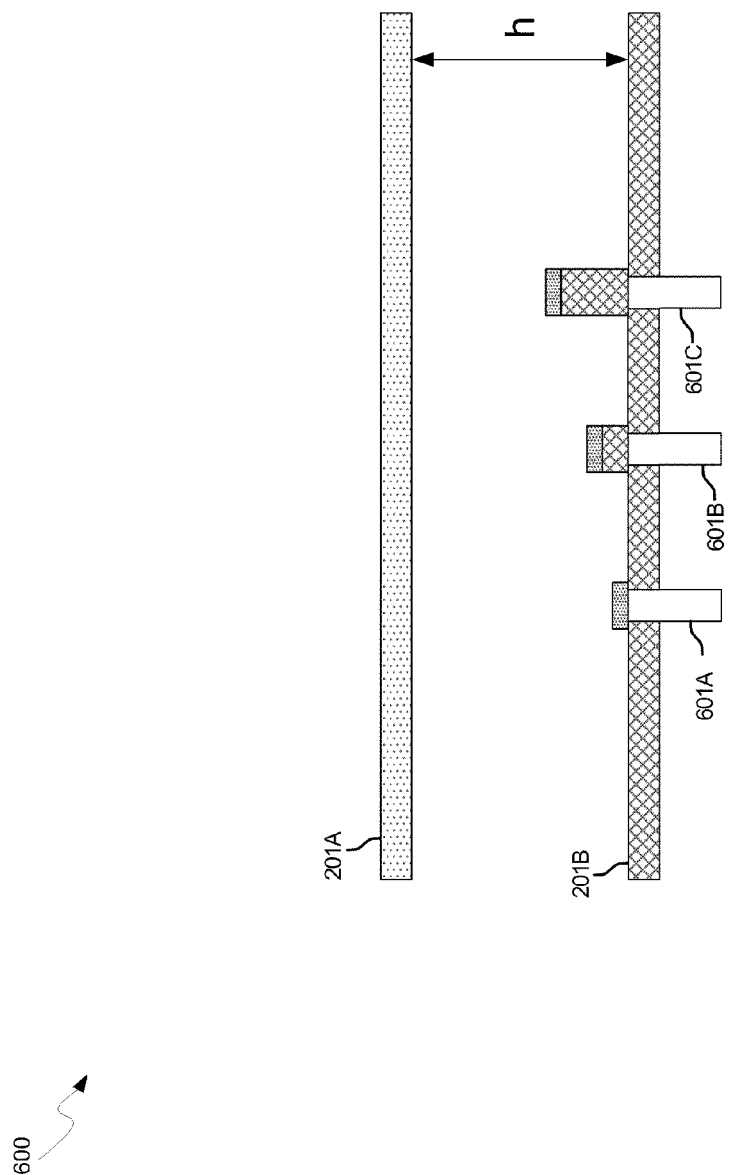
FIG. 6 is a block diagram illustrating a leaky wave antenna with variable input impedance feed points, in accordance with an embodiment of the invention.

FIG. 6 is a block diagram illustrating a leaky wave antenna with variable input impedance feed points, in accordance with an embodiment of the invention. Referring to FIG. 6, there is shown a leaky wave antenna 600 comprising the partially reflective surface 201A and the reflective surface 201B. There is also shown feed points 601A-601C. The feed points 601A-601C may be located at different positions along the height, h, of the cavity thereby configuring different impedance points for the leaky wave antenna.

In this manner, a leaky wave antenna may comprise an inductance in a tank circuit that may be operable to configure an output signal frequency by allowing signals to pass that are at or near the resonant frequency of the tank circuit, while filtering signals that are not near the resonant frequency.

FIG. 7 is a block diagram of a voltage-controlled oscillator with a tank circuit including a leaky wave antenna, in accordance with an embodiment of the invention. Referring to FIG. 7, there is shown a VCO 700 comprising a tank circuit 701, a current source 703, and transistors $M_{VCO1}$, $M_{VCO2}$, $M_{TP1A}$, $M_{TP1B}$, $M_{TP2A}$, and $M_{TP2B}$. There is also shown input signals P1 and P2.

The tank circuit 701 may comprise impedances, such as inductors and capacitors, coupled in parallel to configure a resonant tank. The resonance frequency of the tank circuit 701 may be configured by a capacitor in parallel with an inductor, for example, as shown in the inset in FIG. 7, where the inductor comprises a leaky wave antenna, such as the leaky wave antennas 164A and/or 164B. In this manner, the tank circuit 701 may be configured to resonate at a desired frequency and transmit wireless signals via a leaky wave antenna. The tank circuit 701 is not limited to the simple LC combination shown. More complex impedance combinations may be utilized depending on the frequency response desired.

The current source 703 may comprise suitable circuitry, logic, interfaces, and/or code that may be operable to supply a current to the VCO 700. The current source 703 may comprise a plurality of CMOS transistors, for example, that may be operable to provide a configurable current through the selection of appropriate sized CMOS transistors. The current may be controlled via a processor, for example, such as the processor 156 or the baseband processor 154 described with respect to FIG. 1.

The transistors $M_{VCO1}$ and $M_{VCO2}$ may comprise CMOS transistors, for example, that may be gate-to-source cross-coupled to enable oscillation of the circuit. The drain terminals of the transistors $M_{VCO1}$ and $M_{VCO2}$ may be coupled to the current source 703 and the source terminals of the transistors $M_{VCO1}$ and $M_{VCO2}$ may be coupled to the tank circuit 701.

The transistors $M_{TP1A}$, $M_{TP1B}$, $M_{TP2A}$, and $M_{TP2B}$ may comprise CMOS transistors, for example, and may be operable to provide a variable capacitance coupled to the tank circuit 701. The transistors may be configured as varactors by shorting the source and drain terminals of each of the transistors $M_{TP1A}$, $M_{TP1B}$, $M_{TP2A}$, and $M_{TP2B}$. In this manner, a variable capacitor may be formed between the gate and the source/drain terminals of the transistor, with a capacitance value that may be configured by the voltage applied to P1 and P2.

In operation, the cross-coupled gates of the transistors $M_{VCO1}$ and $M_{VCO2}$ may enable oscillation of the VCO 700. The tank circuit 701 may be operable to configure the frequency of oscillation of the VCO 700. By tuning the voltage at P1 and P2, the capacitance values of the transistors $M_{TP1A}$, $M_{TP1B}$, $M_{TP2A}$, and $M_{TP2B}$ may tune the resonance frequency of the tank circuit 701, thereby adjusting the frequency of the VCO 700.

In an embodiment of the invention, one or more inductances in the tank circuit 701 may comprise leaky wave antennas. In this manner, wireless signals may be transmitted by leaky wave antennas in the tank circuit 701, enabling direct transmission of signals by a VCO without the need for buffers and/or power amplifiers. In another embodiment of the invention, the frequency of the VCO 700 may be configured by varying the current through the current source 703.

In another embodiment of the invention, FM transmission may be generated by modulating the frequency of the VCO via P1 and P2 and transmitting the resulting signal via one or more leaky wave antennas in the tank circuit 701.

FIG. 8 is a block diagram of a phase-locked loop with two-point modulation utilizing a voltage-controlled oscillator and a tank circuit including a leaky wave antenna, in accordance with an embodiment of the invention. Referring to FIG. 8, there is shown a phase-locked loop (PLL) 800 comprising a clock source 801, a phase-frequency detector (PFD) 803, a charge pump 805, low-pass filters (LPFs) 807A and 807B, an adder 809, a VCO 811, a multi-modulus detector (MMD) 813, an MMD control module 815, an amplifier 817, and a digital-to-analog converter (DAC) 819. There is also shown a control/modulation signal 821. The VCO 811 may be substantially similar to the VCO 700 described with respect to FIG. 7.

The clock source 801 may comprise suitable circuitry, logic, interfaces, and/or code that may be operable to supply a stable clock signal to the PLL 800. The clock source 801 may comprise a crystal oscillator, for example, but need not be so limited, and as such may comprise any clock signal generator available depending on chip area and package, and cost limitations.

The PFD 803 may comprise suitable circuitry, logic, interfaces, and/or code that may be operable to receive two or more input signals and determine the phase difference between the received signals. The PFD 803 may generate an output signal that is proportional to the phase difference between the received signals. The output of the PFD 803 may be communicatively coupled to the charge pump 805.

The charge pump 805 may comprise suitable circuitry, logic, interfaces, and/or code that may be operable to charge and/or discharge the LPF 807A, depending on a signal received from the PFD 803. The charge pump 805 may comprise a charge-up current source and a charge-down current source, for example, that may be operable to charge capacitors in the LPF 807A and/or allow capacitors in the LPF 807A to discharge.

The LPFs 807A and 807B may comprise suitable circuitry, logic, interfaces, and/or code that may be operable to filter signals above a frequency configured by resistors and capacitors in the filters, and may allow frequencies below the configured frequency to pass. The LPF 807A may comprise a loop filter for the PLL 800 and may be enabled to filter signals from the charge pump 805. The LPF 807B may be operable to filter noise signals out of analog signals generated by the DAC 819.

The adder 809 may comprise suitable circuitry, logic, interfaces, and/or code that may be operable to sum two or more signals, the sum of which may be communicated to the VCO 811. The adder 809 may comprise a plurality of source-drain shorted CMOS transistors with the gates coupled to a tank circuit in the VCO 811, substantially as shown in FIG. 7 by the transistors $M_{TP1A}$, $M_{TP1B}$, $M_{TP2A}$, and $M_{TP2B}$.

The MMD 813 may comprise suitable circuitry, logic, interfaces, and/or code that may be operable to divide the frequency of a signal received from the VCO 811. The divided frequency signal may be communicated to the PFD 803 to generate an error signal to enable frequency locking of the VCO 811. The MMD 813 may also receive an input signal from the MMD control module 815 to enable a wider frequency locking of the PLL 800 by communicating a range of frequencies to the PFD 803.

The MMD control module 815 may comprise suitable circuitry, logic, interfaces, and/or code that may be operable to generate a control signal for the MMD 813. The MMD control module 815 may receive as inputs, the control/modulation signal 821 and the output of the MMD 813. In this manner, the MMD control module 815 may be operable to determine the difference between a desired frequency signal and a frequency of a signal generated by the VCO 811 as measured by the MMD 813.

The amplifier 817 may comprise suitable circuitry, logic, interfaces, and/or code that may be operable to amplify the control/modulation signal 821. The gain, $K_D$, of the amplifier 817 may be configurable by a processor, such as the processor 156 and/or the baseband processor 154.

The DAC 819 may comprise suitable circuitry, logic, interfaces, and/or code that may be operable to convert a digital signal to an analog signal. In this manner, a digital system, such as a processor, may control an analog VCO. The DAC 819 may receive the output signal of the amplifier 817 and communicate a digital signal to the LPF 807B.

In operation, a clock signal may be communicated to the PFD 803 from the clock source 801. The PFD 803 may compare the phase of the received clock signal to the output generated by the MMD 813, which may comprise a frequency-divided version of the output signal of the VCO 811. The output of the PFD 803 may comprise an error signal which may indicate to the charge pump 805 when to charge or discharge the LPF 807A. The LPF 807A may generate a filtered output signal that may be proportional to the error signal generated by the PFD 803. The filtered signal may comprise the input signal P1, and may be communicated to the adder 809. A second signal, P2, may be communicated to the adder 809 from the LPF 807B.

The control and/or modulation signal 821 may be communicated to the amplifier 817. The amplified signal may then be communicated to the DAC 819 and subsequently communicated to the LPF 807B, before being communicated to the adder 809. The summed signal may be communicated to the VCO 811 to modulate the frequency of the VCO 811. In this manner, two-point modulation of the VCO 811 may be enabled.

In an embodiment of the invention, the VCO 811 may comprise a tank circuit load with a leaky wave antenna, as described with respect to FIG. 7. Thus, by utilizing two-point modulation and leaky wave antennas in the VCO 811, a broad frequency response signal may be transmitted directly from the VCO 811. The frequency of the VCO 811 may be modulated via P1 and P2, such that the PLL 800 may be enabled to transmit FM signals, without the need for buffers or power amplifiers.

FIG. 9 is a block diagram illustrating exemplary steps for two-point modulation of a voltage-controlled oscillator with a leaky wave antenna, in accordance with an embodiment of the invention. Referring to FIG. 9, in step 903 after start step 901, a tank circuit may be configured with a leaky wave antenna inductance. In step 905, the VCO frequency may be modulated using a PLL path and/or a direct modulation using a modulation signal via a DAC and low-pass filter, followed by step 907, where the PLL may lock to the VCO signal. Additionally, the leaky wave antenna in the tank circuit may transmit FM signals based on the received modulation signals. If, in step 909, the wireless device 150 is to be powered down, the exemplary steps may proceed to end step 911. In instances when the wireless device 150 is not to be powered down, the exemplary steps may proceed back to step 903 to configure the tank circuit.

In an embodiment of the invention, a method and system are disclosed for transmitting wireless signals via one or more leaky wave antennas 164A and/or 164B in one or more tank circuits 165 and/or 701 coupled to one or more VCOs 700 and/or 811. The VCOs 700 and/or 811 may be two-point modulated. In this regard, two (2) modulating signals may be communicated to the one or more VCOs 700 and/or 811 via varactors coupled to tank circuits on the one or more VCOs 700 and/or 811. The varactors may comprise CMOS transistors $M_{TP1A}$, $M_{TP1B}$, $M_{TP2A}$, $M_{TP2B}$ with source and drain terminals shorted together. The one or more leaky wave antennas 164A and/or 164B may be integrated on the chip 162, on a package 167 to which the chip 162 is affixed, or on a printed circuit board 171 to which the chip 162 is affixed. The VCOs 700 and/or 811 may be integrated in a phase-locked loop 800 and an output of the one or more VCOs 700 and/or 811 in the phase-locked loop 800 may be fed back via a multi-modulus detector 815.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for a voltage-controlled oscillator with a leaky wave antenna.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for communication, the method comprising:
performing using one or more circuits on a chip in a wireless device, said one or more circuits comprising one or more leaky wave antennas, and a voltage controlled-oscillator separate from and utilizing said one or more leaky wave antennas as inductors in a tank circuit:
configuring an impedance of said one or more leaky wave antennas disposed in said tank circuit by adjusting a placement of a feedpoint within each of said one or more leaky wave antennas;
transmitting wireless signals via said one or more leaky wave antennas.

2. The method according to claim 1, comprising two-point modulating said voltage-controlled oscillator.

3. The method according to claim 1, wherein said one or more circuits comprise varactors coupled to said tank circuit in said voltage-controlled oscillator, said one or more circuits communicating two modulating signals to said voltage-controlled oscillator via said varactors.

4. The method according to claim 3, wherein said varactors comprise CMOS transistors.

5. The method according to claim 4, wherein source and drain terminals of each of said CMOS transistors are shorted together.

6. The method according to claim 1, wherein said one or more leaky wave antennas are integrated on said chip.

7. The method according to claim 1, wherein said one or more leaky wave antennas are integrated on a package to which said chip is affixed.

8. The method according to claim 1, wherein said one or more leaky wave antennas are integrated on a printed circuit board to which said chip is affixed.

9. The method according to claim 1, wherein said voltage-controlled oscillator is integrated in a phase-locked loop.

10. The method according to claim 9, comprising feeding back an output of said voltage-controlled oscillator in said phase-locked loop via a multi-modulus detector.

11. A system for enabling communication, the system comprising:
one or more circuits on a chip in a wireless device, said one or more circuits comprising one or more leaky wave antennas, and a voltage controlled-oscillator separate from and utilizing said one or more leaky wave antennas as inductors in a tank circuit, said one or more circuits being configured to:
configure an impedance of said one or more leaky wave antennas disposed in said tank circuit by adjusting a placement of a feedpoint within each of said one or more leaky wave antennas;
transmit wireless signals via said one or more leaky wave antennas.

12. The system according to claim 11, wherein said one or more circuits are operable to two-point modulate said voltage-controlled oscillator.

13. The system according to claim 11, wherein said one or more circuits comprise varactors coupled to said tank circuit in said voltage-controlled oscillator, said one or more circuits being operable to communicate two modulating signals to said voltage-controlled oscillator via said varactors.

14. The system according to claim 11, wherein said varactors comprise CMOS transistors.

15. The system according to claim 11, wherein source and drain terminals of each of said CMOS transistors are shorted together.

16. The system according to claim 11, wherein said one or more leaky wave antennas are integrated on said chip.

17. The system according to claim 11, wherein said one or more leaky wave antennas are integrated on a package to which said chip is affixed.

18. The system according to claim 11, wherein said one or more leaky wave antennas are integrated on a printed circuit board to which said chip is affixed.

19. The system according to claim 11, wherein said voltage-controlled oscillator is integrated in a phase-locked loop.

20. The system according to claim 19, wherein said one or more circuits comprise a multi-modulus detector, and said one or more circuits are operable to feed back an output of said voltage-controlled oscillator in said phase-locked loop via said multi-modulus detector.

* * * * *